United States Patent [19]

Suzuki et al.

[11] Patent Number: 5,468,594
[45] Date of Patent: Nov. 21, 1995

[54] IMAGE FORMING PROCESS

[75] Inventors: Tamotsu Suzuki; Mikio Totsuka; Chiyomi Niitsu; Fumiaki Shinozaki, all of Shizuoka, Japan

[73] Assignee: Fuji Photo Film Co., Ltd., Kanagawa, Japan

[21] Appl. No.: 268,777

[22] Filed: Jun. 30, 1994

Related U.S. Application Data

[63] Continuation of Ser. No. 936,747, Aug. 27, 1992, abandoned.

[30] Foreign Application Priority Data

Sep. 2, 1991 [JP] Japan ................................. 3-248299

[51] Int. Cl.$^6$ ................................................. G03F 9/00
[52] U.S. Cl. ........................... 430/294; 430/325; 430/331
[58] Field of Search ................................. 430/294, 331, 430/325

[56] References Cited

U.S. PATENT DOCUMENTS

| | | | |
|---|---|---|---|
| 2,950,970 | 8/1960 | Schwan | 430/493 |
| 4,378,423 | 3/1983 | Suezawa et al. | 430/303 |
| 5,002,850 | 3/1991 | Shinozaki et al. | 430/166 |
| 5,141,843 | 8/1992 | Ooms et al. | 430/489 |

Primary Examiner—James J. Seidleck
Assistant Examiner—R. F. Johnson
Attorney, Agent, or Firm—McAulay Fisher Nissen Goldberg & Kiel

[57] ABSTRACT

Disclosed is an image forming process employing a light-sensitive image forming material and a developing solution. The image forming material comprises a support and either a light-sensitive resin layer containing a pigment or a colorant layer containing a pigment and a light-sensitive resin layer, superposed in order. The process comprises the steps of imagewise exposing the image forming material to light and developing the material by the use of an alkaline developing solution containing at least one of compounds having the following formula (1):

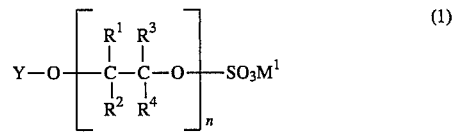

wherein each of $R^1$, $R^2$, $R^3$ and $R^4$ independently represents hydrogen, an alkyl group having 1 to 5 carbon atoms which may be substituted or an aryl group which may be substituted, $M^1$ represents hydrogen, potassium or an ammonium group, Y represents hydrogen or $-SO_3M_2$ (in which $M^2$ represents sodium, potassium or an ammonium group and $M^2$ may be the same as or different from $M^1$) and n represents a number in the range of 1 to 1000; to form an image on the support.

6 Claims, No Drawings

IMAGE FORMING PROCESS

This is a continuation of application Ser. No. 07/936,747, filed Aug. 27, 1992, now abandoned.

FIELD OF THE INVENTION

This invention relates to a process for forming an image by imagewise exposing a light-sensitive image forming material to light and developing by the use of a developing solution to form an image which is particularly utilized in the field of printing arts.

BACKGROUND OF THE INVENTION

A light-sensitive image forming material has a layer comprising a light-sensitive resin which is capable of forming an image by imagewise exposure. The light-sensitive resin comes to be soluble or insoluble in a solvent accompanying to its molecular structure change caused by exposure of light. The formation of an image is performed by taking advantage of an above phenomenon of the light-sensitive resin. The light-sensitive image forming material have such light-sensitive resin is utilized in the fields of printing plates such as a PS (Presensitized) lithograph and a resin relief plate, photoresists such as a film type photoresist, color proofs in prepress, and lith-films for dot to dot work.

For example, a light-sensitive image forming material employable for a proof to confirm hue and tone of a finished print has a structure comprising a support (may be referred to as tentative support hereinafter) and a light-sensitive resin layer containing a pigment provided thereon or a structure comprising a support and both a colorant layer containing a pigment and a light-sensitive resin layer provided thereon in order. If necessary, a peel layer comprising an organic polymer, or the peel layer and a barrier layer comprising an organic polymer is provided on the support.

In the case of using the above light-sensitive image forming material for an image forming material (light-sensitive transferring sheet) in the surprint method (which is one of color proofing methods), the material is image-wise exposed to light to form an image on the support or the peel layer through developing and then the resultant separation image is transferred to a desired support to prepare a color proofing sheet having the separation image.

Such color proofing sheet is used to confirm hue and tone of a finished print as mentioned above, so that a separation image formed on a light-sensitive image forming material is desired to show a distinct hue.

To form a color image on a light-sensitive image forming material, a colorant material in the light-sensitive resin layer generally uses an organic pigment which is excellent in various characteristics such as sharpness, concentration (coloring power) and richness of hue. In more detail, a color image is obtained by applying a coating solution prepared through mixing the organic pigment and a light-sensitive resin to a support or a peel layer provided on a support to prepare a light-sensitive image forming material, and imagewise exposing the material to light and then removing a soluble portion of the resin layer by developing by the use of a developing solution.

It is deemed that developing solution used in the developing procedure plays an important role in whether a color image showing excellent characteristics mentioned above can be obtained or not. As a developing solution, for example, Japanese Provisional Patent Publication Nos. 62 (1987)-67529 and 63(1988)-74052 disclose an alkaline developing solution containing butyl cellosolve. Further, Japanese Provisional Patent Publication Nos. 1 (1989)-82543 and 3 (1991)-198046 disclose an alkaline developing solution containing a surface active agent, which is a mixture of plural compounds represented by the following formula:

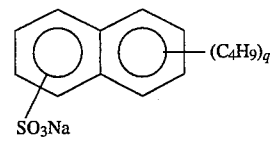

and is available from Kao Atlas Co., Ltd. as a trade name of Perex NBL.

The addition of the surface active agent or butyl cellosolve to the developing solution is effective to improve wetting properties for the light-sensitive resin layer and therefore occasionally shorten developing time.

The study of the present inventors, however, have revealed that even use of the developing solution containing the surface active agent and the like can not bring about the formation of an image having excellent characteristics (sharpness, coloring power and richness of hue) in a reduced developing time In more detail, use of the developing solution is apt to bring about occurrence of fog of a coloring material on the support or the peel layer and the occurrence of fog is not sufficiently prevented even if the developing time is prolonged.

SUMMARY OF THE INVENTION

To solve the above problem, the inventors have studied the composition of the developing solution. As a result of the study, it has been revealed that addition of a sulfate compound having the formula (1) described below to a conventional alkaline developing solution permits developing time of a light-sensitive image forming material to reduce and prevents an image formed on a light-sensitive image forming material (on a support or a peel layer) from the occurrence of fog.

An object of the present invention is to provide an image forming process which is capable of forming a distinct image showing little occurrence of fog of a coloring material even in a reduced developing time.

Another object of the present invention is to provide an image forming process which is capable of processing the number of light-sensitive image forming materials more than that in conventional process in the case of using a definite amount of developing solution.

Further, an object of the present invention is to provide an image forming process in which little bubbles occur in a developing procedure.

There is provided by the present invention an image forming process comprising the steps of:

imagewise exposing to light a light-sensitive image forming material comprising either a support and a light-sensitive resin layer containing a pigment thereon, or a support, a colorant layer containing the pigment thereon and a light-sensitive resin layer provided on the colorant layer, and developing the image forming material by the use of a developing solution which contains at least one of compounds having the following formula (1):

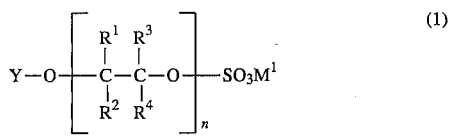

(1)

wherein each of $R^1$, $R^2$, $R^3$ and $R^4$ independently represents hydrogen, an alkyl group having 1 to 5 carbon atoms which may be substituted or an aryl group which may be substituted, $M^1$ represents hydrogen, potassium or an ammonium group, Y represents a hydrogen atom or $-SO_3M^2$ (in which $M^2$ represents sodium, potassium or an ammonium group and $M^2$ may be the same as or different from $M^1$) and n represents a number in the range 1 to 1000, to form an image on the support The embodiments of the present invention are as follows:

1) The image forming process wherein $R^1$, $R^2$ and $R^3$ each is hydrogen, $R^4$ is hydrogen or methyl group and n is in the range of 2 to 200.

2) The image forming process wherein the developing solution contains the compounds having the formula (1) in the concentration from 0.001 to 20 weight %.

3) The image forming process wherein the support has a peel layer thereon.

4) The image forming process as claimed in claim 1, wherein the support has a peel layer and a barrier layer superposed thereon in order.

5) The image forming process as claimed in claim 1, wherein the developing solution contains a sulfate type surface active agent, a sulfonate type surface active agent or a phosphate surface active agent.

6) The image forming process wherein the developing solution contains a silicone type anti-foaming agent (an anti-foaming agent comprising silicone).

The image forming process according to the invention enables the formation of a distinct image on the light-sensitive image forming material (the peel layer) by reduction of fog of a coloring material even if its developing time is allowed to reduce, and therefor enables processing of the number of light-sensitive image forming materials (films) more than that in conventional process in the case of using a definite amount of developing solution.

Although it is not necessarily apparent how use of the developing solution containing the above sulfate compound having the formula (1) reduces fog of a coloring material and a developing time, it is deemed as follows:

The sulfate compound contained in the alkaline developing solution is apt to be adsorbed on the surface of the light-sensitive resin layer in the developing procedure. The compound adsorbed on the light-sensitive resin layer so serves as to help the penetration of the alkaline developing solution into the layer. Hence, a soluble portion of the layer is rapidly and distinctly dissolved in the alkaline developing solution.

Anyway, as is shown by Examples and Comparison Examples described later, there is large difference between developing time in the case of use of the compound (the formula (1)) and that in the case of use of a conventional surface active agent. Further, little fog occurs on the support or the peel layer in the case of use of the compound (the formula (1)). Hence, the compound apparently shows a specific effect.

In this way, adoption of the image forming process of the invention reduces the fog on the support or peel layer to form a distinct image. Accordingly, the process can be utilized advantageously in formation of a color image on a color proofing sheet by a surprint method.

DETAILED DESCRIPTION OF THE INVENTION

The image forming process according to the present invention basically comprising the following steps:

(1) imagewise exposing to light a light-sensitive image forming material comprising a support and a light-sensitive resin layer containing a pigment (or a colorant layer containing the pigment and a light-sensitive resin layer), superposed in order, to form a latent image in the light-sensitive resin layer and (2) developing the latent image in the photo-sensitive resin layer (or the colorant layer and a light-sensitive resin layer) using a developing solution containing the above sulfate compound to remove a soluble portion of the latent image (the light-sensitive resin layer) and then form an image on a support or a peel layer provided on the support.

The light-sensitive image forming material employable for the process of the invention is prepared according to the process described below.

The support serves for supporting various layers (e.g., a peel layer, and a light-sensitive resin layer) provided thereon. The material of the support preferably has an excellent heat-resistance and chemical-resistance, and flexibility. Further, in the case that an exposing of the material to light is conducted using light applied from the support side, the support is preferred to have a large transmittance at a wavelength of the light source using for the exposure.

Examples of materials of the support include polyesters such as polyethylene terephthalate (PET), polycarbonate, polystyrene, cellulose derivatives such as cellulose triacetate, polyolefins such as polypropylene, polyacrylonitrile, polyvinyl chloride, polyvinylidene chloride, polyacrylates such as PMMA (polymethyl methacrylate), polyamides such as nylon, polyimide and polysulfone. Further, there can be mentioned examples described in Japanese Provisional Patent Publication Nos. 47 (1972)-41830, 48 (1973)-9337 and 51 (1976)-5101. Preferred are polyethylene terephthalate, polycarbonate and heat-treated materials thereof. The thickness of the support is generally in the range of 5 to 300 μm, and preferably in the range of 20 to 150 μm.

On the surface of the support opposite to the light-sensitive resin layer, a back layer comprising a polymer such as polyvinyl butyral, polyvinyl chloride, polyvinyl acetate or cellulose acetate resin may be provided from the viewpoint of improvement of workability. Further, the back layer may be contain various additives such as a matting agent.

Although on the support may be provided the light-sensitive resin layer containing a pigment and a light-sensitive resin or the colorant layer containing a pigment, the peel layer or the peel layer and the barrier layer is preferably formed on the support before the formation of the light-sensitive resin layer or the colorant layer. In more detail, it is preferred that either the peel layer first is formed on the support and the light-sensitive resin layer or the colorant layer is formed on the peel layer, or the peel layer and the barrier layer are formed on the support in order and the light-sensitive resin layer or the colorant layer is formed on the barrier layer. The barrier layer on the peel layer prevents the peel layer from invasion of a solvent or an alkaline solution because the barrier layer is excellent in solvent resistance and alkali resistance.

Materials employable for the peel layer can be appropriately selected from known materials for a peel layer. Examples of such materials include alcohol-soluble polyamide, polyhydroxystyrene, polyvinyl acetate, poly(meth)

acrylate (acrylic resin), polyvinyl chloride, polyvinyl butyral, methyl methacrylate/acrylate (e.g., ethyl acrylate) copolymer, cellulose acetate butyrate, ethylene/unsaturated carboxylic acid copolymer and metal bridge thereof, vinyl chloride/vinyl acetate copolymer, cellulose diacetate, cellulose triacetate, polyvinyl alcohol and a composition prepared by blending styrene/partially esterificated maleic anhydride copolymer with methoxymethylated nylon. These materials can be employed singly or in combination. The mixture of alcohol-soluble polyamide and polyhydroxystyrene is preferred.

The peel layer is formed by coating a coating solution prepared through dissolving the above materials in an appropriate solvent on the support and drying the coated layer. The coating solution may be contain various surface active agents for improvement of the surface state of the peel layer. Particularly, fluorine type (fluorine containing) surface active agents are preferred. The thickness of the peel layer is generally in the range of 0.1 to 20 µm, preferably in the range of 0.2 to 5 µm and more preferably in the range of 0.3 to 3 µm.

The barrier layer is generally formed on the peel layer. Examples of materials employable for the barrier layer include polyacrylate, polymethacrylate (e.g., polymethylmethacrylate), acrylate/methacrylate copolymer. polyacrylamide and acrylamide/monomer polymerizable with the acrylamide copolymer. Preferred is polymethylmethacrylate.

The barrier layer is formed by coating a coating solution prepared through dissolving the above materials in an appropriate solvent on the support and drying the coated layer. The coating solution may contain various surface active agents. The thickness of the barrier layer is generally in the range of 0.1 to 20 µm, preferably in the range of 0.2 to 5 µm and more preferably in the range of 0.3 to 3 µm.

The principal example of the light-sensitive resin material employed in the invention has a structure consisting of a support, a peel layer, (a barrier layer if necessary) and a light-sensitive resin layer containing a pigment superposed in order.

Materials employable for the light-sensitive resin layer can be selected from known light sensitive resin materials. As N→P (negative to positive) type light-sensitive resin (i.e., resin for forming a negative working light-sensitive resin layer), a composition prepared by blending an azide type light-sensitive agent such as 2,6-di(4'-azidobenzal)cyclohexane with a novolak type phenolformaldehyde resin, and a composition prepared by blending a polyfunctional monomer such as trimethylolpropane triacrylate with a photopolymerization initiator such as Michler's ketone using benzyl methacrylate/methacrylic acid copolymer as a binder are preferred. As P→P (positive to positive) type light-sensitive resin (i.e., resin for forming a positive working light-sensitive resin layer), a light-sensitive resin composition containing a quinoneazide type light-sensitive agent such as o-quinonediazide is preferred.

The pigment contained in the light-sensitive resin layer can be selected from known various inorganic and organic pigments. As the materials of the pigments, there can be mentioned a variety of pigments described in Japanese Patent Provisional Publications No. 47(1972)-16124 and No. 52(1977)-89916, U.S. Pat. No. 4,472,494, Japanese Patent Provisional Publications No. 55(1980)-117142 and No. 55(1980)-127552, and Color Index.

The content of the pigment contained in the light-sensitive resin layer, although fluctuates depending on its shape or its particle size, is generally in the range of 1 to 30 weight % based on the weight of the total solids in the layer, and preferably in the range of 2 to 10 weight %.

The light-sensitive resin layer containing a pigment is formed on the peel layer (or the barrier layer) by preparing a coating solution by mixing the light-sensitive resin, the above pigment and an appropriate solvent, coating the resultant solution on the peel layer (or the barrier layer) and then drying the coated layer to form the light-sensitive resin layer. The thickness of the light-sensitive resin layer containing a pigment is generally in the range of 0.5 to 100 µm, preferably in the range of 1.0 to 50 µm and more preferably in the range of 1.0 to 20 µm.

The light-sensitive image forming material used in the image forming process of the invention may have two layers comprising both a colorant layer containing the above pigment provided on the peel layer and a light-sensitive resin layer containing no pigment provided (which may be superposed in order or in reverse order) instead of the light-sensitive resin layer containing the pigment.

The colorant layer is generally a layer comprising the above pigment or the pigment and resin. As materials of the resin, the resin materials employed in the light-sensitive resin layer mentioned above can be generally employed. For example, alkali-soluble type resins such as a novolak type phenol-formaldehyde resin and benzyl methacrylate/methacrylic acid copolymer can be mentioned. Further, a monomer such as polyfunctional monomer and a photopolymerization initiator may be employed.

The colorant layer containing a pigment is formed on the support, the peel layer or the barrier layer (otherwise the light-sensitive resin layer) by preparing a coating solution by mixing the pigment or the pigment and the above resin, and an appropriate solvent, coating the resultant solution on the peel layer or the above layers and then drying the coated layer to form the colorant layer. The thickness of the colorant layer containing a pigment is generally in the range of 0.5 to 5 µm, preferably in the range of 1.0 to 3.0 µm and more preferably in the range of 1.0 to 2.5 µm.

A light-sensitive resin layer provided on or under the colorant layer generally is a light-sensitive resin layer containing no pigment, and is the same as the light-sensitive resin layer containing pigment except for containing no pigment.

The light-sensitive resin layer containing no pigment is formed on the colorant layer, otherwise on the support, the peel layer or the barrier layer (i.e., under the colorant layer) by preparing a coating solution by mixing the light-sensitive resin and an appropriate solvent, coating the resultant coating solution on the colorant layer or the above other layers and then drying the coated layer to form the light-sensitive resin layer. The thickness of the light-sensitive resin layer containing no pigment is generally in the range of 0.5 to 5 µm, preferably in the range of 1.0 to 3.0 µm and more preferably in the range of 1.0 to 2.5 µm.

In the case that the light-sensitive resin is the N→P type, a protective layer is preferably formed on the light-sensitive resin layer. Examples of polymers employable for the protective layer include polyvinyl alcohol, polyvinyl acetate, methyl vinyl ether/maleic anhydride copolymer, poly(N-vinylpyrrolidone), gelatin and gum arabic. The protective layer is formed by coating a solution of the polymer above on the light-sensitive resin layer and drying the coated layer.

The developing solution used in the invention is an aqueous alkaline solution containing at least one of compounds having the following formula (1):

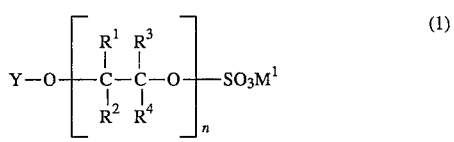

(1)

wherein each of $R^1$, $R^2$, $R^3$ and $R^4$ independently represents hydrogen, an alkyl group having 1 to 5 carbon atoms which may be substituted or an aryl group which may be substituted, $M^1$ represents hydrogen, potassium or an ammonium group, Y represents hydrogen or $-SO_3M^2$ (in which $M^2$ represents sodium, potassium or an ammonium group and $M^2$ may be the same as or different from $M^1$) and n represents a number in the range 1 to 1000.

The alkyl group having 1 to 5 carbon atoms represented by $R^1$, $R^2$, $R^3$ and $R^4$ is preferred to be methyl, ethyl, n-propyl, isopropyl, n-butyl, isobutyl or n-pentyl, the substituent on the alkyl group is preferred to be a halogen atom such as chlorine. The aryl group represented by $R^1$, $R^2$, $R^3$ and $R^4$ is preferred to be phenyl or naphthyl, and the substituent on the aryl group is preferred to be methyl. It is particularly preferred that $R^1$, $R^2$ and $R^3$ are hydrogen and $R^4$ is hydrogen or methyl.

The compound represented by the formula (1) is generally a mixture consisting of various compounds having "n" of different values. Accordingly, "n" of the formula (1) indicates a mean of values of "n" which compounds constituting the mixture have. "n" is preferred in the range of 2 to 200.

In a compound represented by the formula (1), a compound in which Y is hydrogen and a compound in which Y is $-SO_3M^2$ can be separately synthesized. However, these compounds are generally obtained in the form of their mixture. The mixture consisting of these compounds can be employed in the present invention. The ratio between the compound having Y of hydrogen and the compound having Y of $-SO_3M^2$ can be arbitrarily allowed to vary by changing their manufacturing conditions.

The developing solution used in the invention may be obtained by addition of the compound represented by the formula (1) to an alkaline developing solution, otherwise the solution may be obtained by addition of the compound represented by the formula (1) wherein $M^1$ and/or $M^2$ are hydrogen to the alkaline developing solution. In the latter case, hydrogen atoms of $M^1$ and/or $M^2$ are substituted for sodium atoms, potassium atoms or ammonium groups which are alkali metals in the developing solution, and therefore the latter case also indicates the same effect as the former case.

Examples of the compounds represented by the formula (1) are as follows:

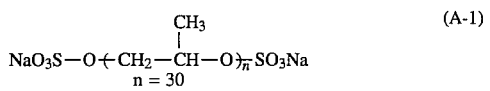
(A-1)

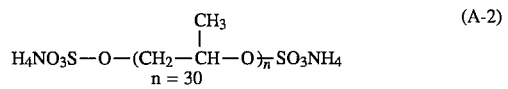
(A-2)

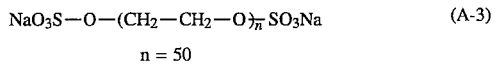
(A-3)

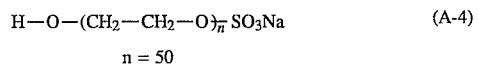
(A-4)

The compound represented by the formula (1), for example, can be easily synthesized by reacting a polymer of unsubstituted or substituted ethylene glycol with sulfuric acid or sulfite (e.g., sodium salt, potassium salt or ammonium salt). Further, the compound is commercially available.

The alkaline developing solution used in the invention generally contains the compounds represented by the formula (1) in the range of 0.001 to 20 weight % and preferably from 0.01 to 1.0 weight %.

The alkaline developing solution used in the invention is an aqueous alkaline solution containing alkali such as sodium hydroxide, potassium hydroxide, sodium silicate, potassium silicate, trisodium phosphate, tripotassium phosphate, sodium carbonate or potassium carbonate, or organic amine such as methyl amine, dimethyl amine, trimethyl amine, ethyl amine, diethyl amine, triethyl amine, isopropyl amine, diisopropyl amine, n-butyl amine, ethanol amine, diethanol amine, triethanol amine, isopropanol amine, diisopropanol amine, triisopropanol amine, ethylene imine or ethylene diimine. The alkaline developing solution may be further contain a poly(N-vinylpyrrolidone). "pH" of the alkaline developing solution is preferred to be not less than 9.5.

The alkaline developing solution used in the invention preferably contain an alkali metal sulfate type surface active agent except the compound represented by the formula (1), an alkali metal sulfonate type surface active agent and/or an alkali metal phosphate type surface active agent.

Examples of the alkali metal sulfate type surface active agent include sulfates of higher alcohol (e.g., sodium lauryl alcohol sulfate, sodium stearyl alcohol sulfate, ammonium octyl alcohol sulfate, ammonium lauryl alcohol sulfate and sodium secondary alcohol sulfate) and glycerol monosulfate represented by $CH_2(OCOR)CH(OH)CH_2(OSO_3Na)$; wherein R is an alkyl group.

Examples of the alkali metal sulfonate type surface active agent include alkali metal aryl sulfonate (e.g., sodium dodecylbenzenesulfonate, sodium isopropylnaphthalenesulfonate, sodium dinaphthalenesulfonate and sodium m-nitrobenzenesulfonate), alkali metal alkylamidesulfonate (e.g., $C_{17}H_{35}CON(CH_3)-CH_2CH_2SO_3Na$), alkali metal sulfonate of dibasic acid aliphatic ester (e.g., sodium sulfosuccinic acid dioctylester, sodium sulfosuccinic acid dihexylester), alkali metal alkyl naphthalenesulfonate (e.g., alkali metal dibutylnaphthalenesulfonate), formaldehyde condensation product of alkali metal alkylnaphthalenesulfonate (e.g., formaldehyde condensation product of alkali metal dibutylnaphthalenesulfonate), and compounds having a skeleton of alkali metal benzoimidazolesulfonate.

Examples of the above alkali metal include lithium, sodium and potassium, and sodium and potassium are preferred from the viewpoint of saving of cost.

Preferable examples of materials of the alkali metal sulfonate type surface active agent are as follows:

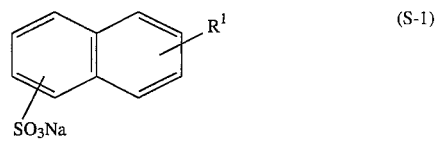
(S-1)

($R^1$: alkyl group of 1–13 carbon atoms)

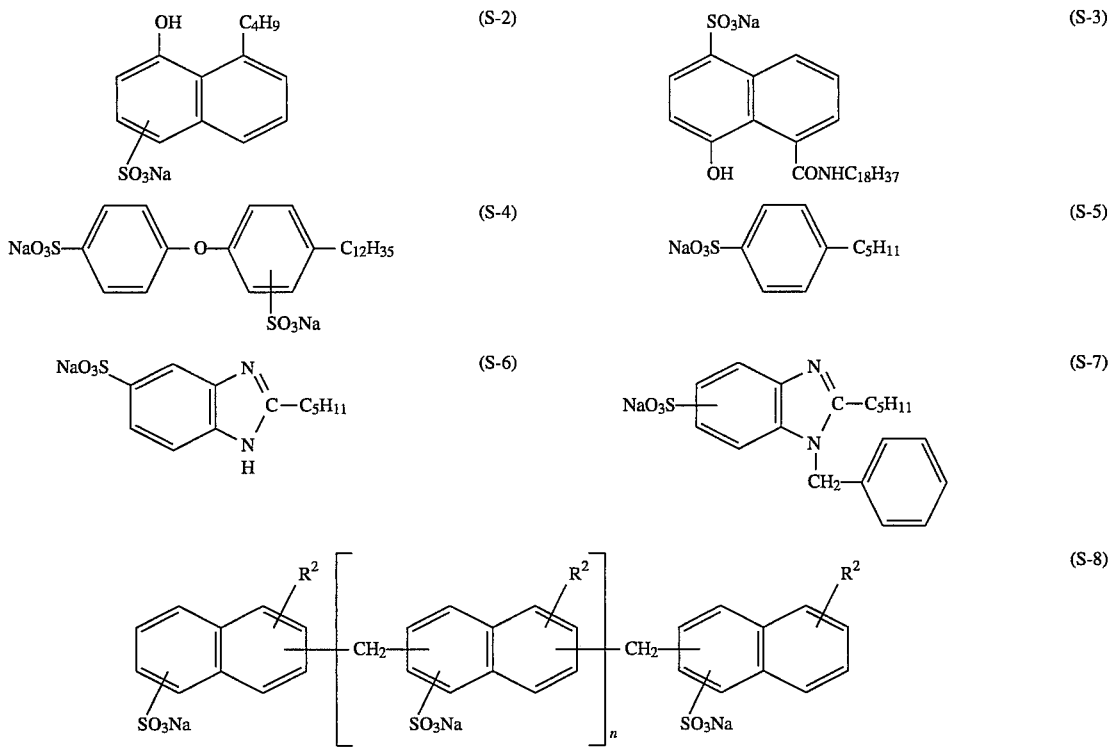

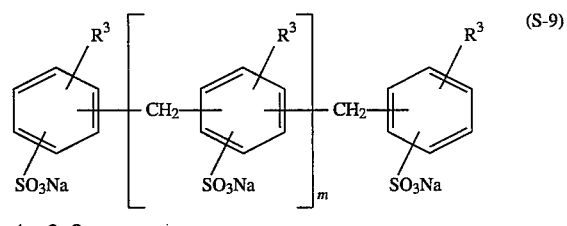

(n:0–8
$R^2$ : H, alkyl group of 1–13 carbon atoms, alkoxy group of 1–8 carbon atoms or hydroxy)

(S-9)

(m:0–8
$R^3$: H, alkyl group of 1–13 carbon atoms, alkoxy group of 1–8 carbon atoms or hydroxy)

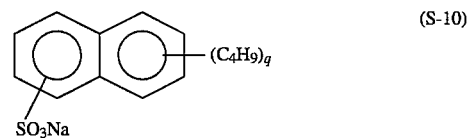

(q:0–3)

Examples of the alkali metal phosphate type surface active agent include aliphatic alcohol phosphates (e.g., sodium cetylalcoholphosphate).

The surface active agent is preferably contained in the developing solution in the range of 0.3 to 4.0 weight % and more preferably in the range of 0.5 to 3.0 weight %.

The developing solution preferably contains a silicone type anti-foaming agent. Examples of the silicone type anti-foaming agent include polydialkylsiloxane (i.e., polydimethylsiloxane), polydiphenylsiloxane or polydialkoxysiloxane. As examples of products of the silicone type anti-foaming agent, there can be mentioned TSF451-500, TSF451-1000, TSF451-1M and TSF3000 (these are trade names of Toshiba Silicone Co., Ltd.). The anti-foaming agent is preferably contained in the developing solution in the range of 0.0001 to 1.0 weight %, and more preferably in the range of 0.001 to 0.1 weight %.

The developing solution may contain organic solvents such as benzyl alcohol, methyl cellosolve, ethyl cellosolve, butyl cellosolve and phenyl cellosolve.

The image forming process of the invention is performed except for using the above aqueous alkali solution containing the specific sulfate type surface active agent (formula (1)) as a developing solution, according to a conventional image forming process including imagewise exposure, development and after-treatment which is adopted in the case of forming an image using a light-sensitive resin material.

A process for preparation of a color proofing sheet, for example, can be performed utilizing the process of the invention as follows:

Imagewise exposure is conducted using color separation masks and irradiating the light-sensitive image forming material containing a corresponding colorant (pigment) with ultra violet rays. After the imagewise exposure, the material is developed with the above aqueous alkali solution containing the specific sulfate type surface active agent (formula (1)), washed with water and dried. This procedure is repeated as often as necessary for preparing differently colored elements to obtain the desired separation images with the desired colors. Thus, the obtained image is then transferred to a image receiving layer (sheet) such as paper.

The present invention is further described by the following examples.

EXAMPLE 1

(A) Preparation of light-sensitive image forming material

A coating solution for forming a peel layer having the following composition was prepared.

| Coating solution for peel layer | |
|---|---|
| Alcohol-soluble polyamide (CM-8000, viscosity: 23 cps (20° C.), available from Toray Industries, Inc.) | 7.2 g |
| Polyhydroxystyrene (Resin M, mean molecular weight: 5,500, available from Maruzen Oil Co., Ltd.) | 1.8 g |
| Methanol | 400 g |
| Methyl cellosolve | 100 g |

The above coating solution was uniformly coated on a polyethylene terephthalate film having the thickness of 100 μm using a whirler, and the coated layer was dried to form a peel layer having thickness of 0.5 μm. Four supports having a peel layer were prepared by repeating the above coating procedure four times.

For the purpose of N→P type image formation, as coating solutions for forming yellow (Y), magenta (M), cyan (C) and black (B) light-sensitive resin layers, four kinds of coating solutions having the following compositions were prepared.

| Coating solution for yellow light-sensitive resin layer | |
|---|---|
| Benzyl methacrylate/methacrylic acid copolymer (Copolymerization ratio (molar ratio): 73/27, viscosity η: 0.12) | 60 g |
| Pentaerythritol tetraacrylate | 43.2 g |
| Michler's ketone | 2.4 g |
| 2-(o-chlorophenyl)-4,5-diphenylimidazol dimer | 2.5 g |
| Seika Fast Yellow H-0755 (available from Dainichiseika Color & Chemicals Mfg. Co., Ltd.) | 9.4 g |
| Methyl cellosolve acetate | 560 g |
| Methyl ethyl ketone | 280 g |

The above "viscosity η" means limiting viscosity in methyl ethyl ketone solution of the polymer at 25° C.

Coating solution for magenta light-sensitive resin layer

The solution has the same composition as that of the yellow light-sensitive resin layer except for changing the Seika Fast Yellow H-0755 into Seika Fast Carmine-1483 (available from Dainichiseika Color & Chemicals Mfg. Co., Ltd.) 5.2 g.

Coating solution for cyan light-sensitive resin layer

The solution has the same composition as that of the yellow light-sensitive resin layer except for changing the Seika Fast Yellow H-0755 into Cyanine blue-4920 (available from Dainichiseika Color & Chemicals Mfg. Co., Ltd.) 5.6 g.

Coating solution for black light-sensitive resin layer

The solution has the same composition as that of the yellow light-sensitive resin layer except for changing the Seika Fast Yellow H-0755 into Mitsubishi carbon black MA-100 (available from Mitsubishi Chemical Industries, Ltd.) 6.6 g.

Each of the four kinds of coating solutions (four colors) was coated on the peel layer of the support and dryed to form a light-sensitive resin layer having thickness of 2.4 μm. Four supports having the four kinds of light-sensitive resin layer were prepared by repeating the above coating procedure four times.

A coating solution for forming a protective layer having the following composition was prepared.

| Coating solution for protective layer | |
|---|---|
| Polyvinyl alcohol (GL-05, available from Nippon Synthetic Chemical Industry Co., Ltd.) | 60 g |
| Water | 970 g |
| Methanol | 30 g | the above coating solution was coated on the four light-sensitive resin layers using a whirler, and the coated layers provided on the four light-sensitive resin layers were dried to form protective layers having thickness of 1.5 μm.

Thus, four kinds (four colors) of light-sensitive image forming materials (negative type colored light-sensitive resin materials) comprising a support, a peel layer, a light-sensitive resin layer and a protective layer, in order superposed, were prepared. (B) Imagewize exposure and development The light-sensitive image forming materials were exposed through a litho-mask (one obtained by imagewise (in an image based a manuscript) on exposing a silver-halide photo-sensitive material to light and developing the material) to a light from a super high-pressure mercury lamp (2 kW) at exposing distance of 50 cm. Thus, latent images were formed in the light-sensitive resin layers.

The exposed materials were developed using the developing solutions having the following compositions (1), (2), (3) and (4) for 20 to 25 minutes at 35° C. to form images.

| Developing solution (1) | |
|---|---|
| $Na_2CO_3$ | 15 g |
| $NaHCO_3$ | 3 g |
| Compound ((A-1) mentioned above) | 3 g |
| Anion type surface active agent (Perex NBL, available from Kao Atlas Co., Ltd.) | 3 g |
| Water | 1000 ml |

Note: The above compound (A-1) is one of examples of compounds represented by the formula (1) which is mentioned previously.

Developing solution (2)

The solution has the same composition as that of the developing solution (1) except for using the compound (A-2) 3 g instead of the compound (A-1).

Developing solution (3).

The solution has the same composition as that of the developing solution (1) except for using the compound (A-3) 3 g instead of the compound (A-1).

Developing solution (4)

The solution has the same composition as that of the developing solution (1) except for using the compound (A-4) 3 g instead of the compound (A-1).

(C) Evaluation of formed image (1) Developing time

Developing time needed to remove the light-sensitive resin layer on the portion having no image using an auto developing machine (Fuji Color Art Processor CA600PII available from Fuji Photo Film Co., Ltd.) was measured as follows.

Time for which the light-sensitive image forming material passes from the inlet of the developing machine to the outlet of the developing machine was measured with variation of the processing speed, and the minimum time for which an obtained image had been unchanged in the extent of the fog was regarded as the developing time.

(2) Fog in a portion having no image

It was observed how a portion (the peel layer) having no image on the light-sensitive resin layer having the formed image was stained by the pigment. The observed result (extent of pigment fog) was evaluated according to the following three ranks.

AA: There is little stain of pigment.
BB: There is a little stain of pigment.
CC: There is a significant amount of stain of pigment.

The result of the above evaluation is set forth in Table 1.

COMPARISON EXAMPLE 1

Light-sensitive image forming materials were prepared in the same manner as in Example 1.

Developing solutions were prepared as follows:
Developing solution (5)

Developing solutions were prepared in the same manner as in the developing solution (1) of Example 1 except for using no the compound (A-1). Developing solution (6)
Developing solutions were prepared in the same manner as in the developing solution (1) of Example 1 except for using sodium dodecylbenzenesulfonate 3 g instead of the compound (A-1).
Developing solution (7)

Developing solutions were prepared in the same manner as in the developing solution (1) of Example 1 except for using sodium sulfosuccinic acid dioctylester 3 g instead of the compound (A-1).

The obtained light-sensitive image forming materials were imagewise exposed to light and developed using the resultant developing solutions ((5)–(7)) to form images in the same manner as in Example 1. The images were evaluated in the same manner as in Example 1.

The result of the above evaluation is set forth in Table 1.

TABLE 1

|  | Developing time (sec.) | | | | Fog | | | |
| --- | --- | --- | --- | --- | --- | --- | --- | --- |
|  | Y | M | C | B | Y | M | C | B |
| Example 1 Developing solution |  |  |  |  |  |  |  |  |
| (1) | 16 | 16 | 18 | 16 | AA | AA | AA | AA |
| (2) | 16 | 16 | 18 | 16 | AA | AA | AA | AA |
| (3) | 18 | 18 | 18 | 18 | AA | AA | AA | AA |
| (4) | 20 | 20 | 20 | 20 | AA | AA | AA | AA |
| Comparison Ex. 1 Developing solution |  |  |  |  |  |  |  |  |
| (5) | 22 | 22 | 22 | 22 | BB | BB | BB | BB |
| (6) | 22 | 22 | 22 | 22 | BB | BB | BB | BB |
| (7) | 22 | 22 | 22 | 22 | BB | BB | BB | BB |

Note; Y:yellow, M:magenta, C:cyan, B:black

EXAMPLE 2

(A) Preparation of light-sensitive image forming material

A coating solution for forming a peel layer having the following composition was prepared.

| Coating solution for peel layer | |
| --- | --- |
| Alcohol-soluble polyamide | 7.2 g |

| -continued | |
| --- | --- |
| Coating solution for peel layer | |
| (CM-8000, viscosity: 23 cps (20° C.), available from Torey Industries, Inc.) | |
| Polyhydroxystyrene | 1.8 g |
| (Resin M, mean molecular weight: 5,500, available from Maruzen Oil Co., Ltd.) | |
| Methanol | 400 g |
| Propylene glycol monomethyl ether | 100 g |

The above coating solution was uniformly coated on a polyethylene terephthalate film having the thickness of 100 µm using a whirler, and the coated layer was dried to form a peel layer having thickness of 0.5 µm. Four supports having a peel layer were prepared by repeating the above coating procedure four times.

A coating solution for forming a barrier layer having the following composition was prepared.

| Coating solution for barrier layer | |
| --- | --- |
| Polymethyl methacrylate | 3 g |
| (mean molecular weight: 100,000) | |
| Methyl ethyl ketone | 80 g |
| Methyl cellosolve acetate | 20 g |

The above coating solution was uniformly coated on a peel layer using a whirler and the coated layer was dried to form a barrier layer having thickness of 0.5 µm. Four supports having a peel layer and a barrier layer were prepared by repetition of the above coating procedure.

For the purpose of formation of a colorant layer, mother liquors (1) and (2) having the following compositions were prepared.

| Mother liquor (1) | |
| --- | --- |
| Styrene/maleic acid copolymer | 20 g |
| (Oxylack SH-101, available from Japan Catalytic Chemical Industry Co., Ltd.) | |
| n-propanol | 80 g |
| Mother liquor (2) | |
| Methoxymethylated Nylon | 10 g |
| (Tresin MF-30, available from Teikoku Kagaku Sangyo Co., Ltd.) | |
| Methanol | 90 g |

Using the mother liquors (1) and (2), four kinds (four colors) of original coating solutions for yellow (Y), magenta (M), cyan (C) and black (B) colorant layers having the following compositions were prepared.

| Original coating solution for yellow light-sensitive resin layer | |
| --- | --- |
| Mother liquor (1) | 95 g |
| Mother liquor (2) | 30 g |
| n-propanol | 28 g |
| Acetone | 20 g |
| Seika Fast Yellow H-0755 | 12.2 g |
| (available from Dainichiseika Color & Chemicals Mfg. Co., Ltd.) | |

Original coating solution for magenta colorant layer

The solution has the same composition as that of the yellow colorant layer except for changing the Seika Fast Yellow H-0755 into Seika Fast Carmine-1483 (available from Dainichiseika Color & Chemicals Mfg. Co., Ltd.) 12.2 g.

Original coating solution for cyan colorant layer

The solution has the same composition as that of the yellow colorant layer except for changing the Seika Fast Yellow H-0755 into Cyanine blue-4920 (available from Dainichiseika Color & Chemicals Mfg. Co., Ltd.) 12.2 g.

Original coating solution for black colorant layer

The solution has the same composition as that of the yellow colorant layer except for changing the Seika Fast Yellow H-0755 into Mitsubishi carbon black MA-100 (available from Mitsubishi Chemical Industries, Ltd.) 12.2 g.

The original coating solutions were prepared by dispersing the mixture consisting of the composition by means of a test dispersion mixer (Paint shaker, available from Toyo Seiki Co., Ltd.) for 6 hours.

A diluent having the following composition to dilute the above original coating solutions was prepared.

| Diluent | |
|---|---|
| Methyl ethyl ketone | 40 g |
| Acetone | 28 g |
| Fluorine-type surface active agent (Flolard FC-430, available from Sumitomo 3M Co., Ltd.) | 0.2 g |

Each of the original coating solutions and the diluent were mixed in the following ratio, stirred for 10 minutes and dispersed by means of ultrasonic wave dispersion, to prepare four kinds (four colors) of coating solutions.

Original coating solution for yellow colorant layer: diluent =3.5:46.5

Original coating solution for magenta colorant layer: diluent =4:46

Original coating solution for cyan colorant layer: diluent =4:46

Original coating solution for black colorant layer: diluent =5.5:44.5

The coating solutions were filtered through a filter (No. 36 filter, available from Toyo Roshi Co., Ltd.). The resultant four kinds of coating solutions each was coated using a whirl on the peel layers of the support and dried at 100° C. for 2 minutes to form a colorant layer. Four kinds of colorant layers were formed by repeating the above coating procedure four times. The colorant layers have the optical density (I.D.) described below.

Yellow colorant layer: I.D.=0.50 (blue filter)

Magenta colorant layer: I.D.=0.75 (green filter)

Cyan colorant layer: I.D.=0.65 (red filter)

Black colorant layer: I.D.=0.90 (no filter)

For the purpose of P→P type image formation, as coating solutions for forming a positive-type light-sensitive resin layer, a coating solutions for a light-sensitive resin layer having the following composition was prepared.

| Coating solution for light-sensitive resin layer | |
|---|---|
| 1,2-naphthoquinone-(2)diazide-5-sulfonic acid cumylphenol ester | 1.36 g |
| Novolak type phenol-formaldehyde resin | 2.86 g |

| Coating solution for light-sensitive resin layer | |
|---|---|
| (PR-50716, available from Sumitomo Dules Co., Ltd.) | |
| Abietic acid | 0.32 g |
| Fluorine-type surface active agent (Megafack F-104, available from Dainippon Ink & Chemicals Inc.) | 0.05 g |
| n-propyl acetate | 84 g |
| Cycohexanone | 42 g |

The coating solution was filtered through a filter (No. 36 filter, available from Toyo Roshi Co., Ltd.). The resultant coating solution was coated using a whirler on each of the four colorant layers and dried at 100° C. for 2 minutes to form a light-sensitive resin layer having thickness of 1 μm. The light-sensitive resin layers were formed on all the four kinds of colorant layers by repeating the above coating procedure four times.

Thus, four kinds (four colors) of light-sensitive image forming materials (positive type colored light-sensitive resin materials) comprising a support, a peel layer, a barrier layer, a colorant layer and a light-sensitive resin layer, superposed in order, were prepared.

(B) Imagewise exposure and development

The light-sensitive image forming materials each was exposed through a litho-mask (one obtained by exposing a silver-halide photo-sensitive material to light and developing the material) to a light from a super high-pressure mercury lamp (2 kW) at exposing distance of 50 cm. Thus, latent images were formed in the light-sensitive resin layers.

The exposed materials each was developed using the developing solutions having the composition (1), (2), (3) or (4) which was used in Example 1, for 20 to 25 minutes at 35° C. to form an image.

The result of the above evaluation is set forth in Table 2.

COMPARISON EXAMPLE 2

Light-sensitive image forming materials were prepared in the same manner as in Example 2.

The obtained light-sensitive image forming materials each was imagewise exposed to light and developed using the developing solution (5), (6) or (7) which was used in Comparison example 1 to form images in the same manner as in Example 2. The images were evaluated in the same manner as in Example 1.

The result of the above evaluation is set forth in Table 2.

TABLE 2

| | Developing time (sec.) | | | | Fog | | | |
|---|---|---|---|---|---|---|---|---|
| | Y | M | C | B | Y | M | C | B |
| Example 2 Developing solution | | | | | | | | |
| (1) | 22 | 22 | 22 | 22 | AA | AA | AA | AA |
| (2) | 22 | 22 | 22 | 22 | AA | AA | AA | AA |
| (3) | 27 | 27 | 27 | 27 | AA | AA | AA | AA |
| (4) | 30 | 30 | 30 | 30 | AA | AA | AA | AA |

TABLE 2-continued

|   | Developing time (sec.) | | | | Fog | | | |
|---|----|----|----|----|----|----|----|----|
|   | Y  | M  | C  | B  | Y  | M  | C  | B  |
| Comparison Ex. 2 Developing solution | | | | | | | | |
| (5) | 33 | 33 | 33 | 33 | BB | BB | BB | BB |
| (6) | 33 | 33 | 33 | 33 | BB | BB | BB | BB |
| (7) | 33 | 33 | 33 | 33 | BB | BB | BB | BB |

Note; Y:yellow, M:magenta, C:cyan, B:black

As is apparent from data of Tables 1 and 2, images obtained in Examples which employ the developing solutions containing the specific compounds showed a distinct image in a reduced developing time. In more detail, in the case that a developing solution (Comparison examples) containing no the specific compounds or a similar compound to the specific compounds is used, the developing time is increased and the obtained image suffers more fog as compared with those in Examples.

We claim:

1. An image forming process comprising the steps of:

imagewise exposing to light a light-sensitive image forming material comprising either a support and a light-sensitive resin layer containing pigment thereon, or a support, a colorant layer containing the pigment thereon and a light-sensitive resin layer provided on the colorant layer, and developing the image forming material by the use of a developing solution which contains at least one compound having the following formula (1):

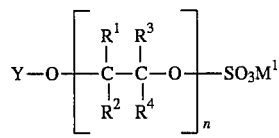

wherein each of $R^1$, $R^2$, $R^3$, and $R^4$ independently represents hydrogen, an alkyl group having 1 to 5 carbon atoms which may be substituted with halogen or an aryl group which may be substituted with methyl, $M^1$ represents hydrogen, potassium or an ammonium group, Y represents hydrogen or $-SO_3M^2$ (in which $M^2$ represents sodium, potassium or an ammonium group and $M^2$ may be the same as or different from $M^1$) and n represents a number in the range of 1 to 1000, to remove a portion of the pigment-containing light-sensitive resin layer or both the colorant layer and the light-sensitive resin layer provided thereon so as to form on the support an image composed of the remaining portion of the layer or layers.

2. The image forming process as claimed in claim 1, wherein $R^1$, $R^2$ and $R^3$ each is hydrogen, $R^4$ is hydrogen or a methyl group and n is in the range of 2 to 200.

3. The image forming process as claimed in claim 1, wherein the developing solution contains the compounds having the formula (1) in the concentration from 0.001 to 20 weight %.

4. The image forming process as claimed in claim 1, wherein the support has a peel layer thereon.

5. The image forming process as claimed in claim 1, wherein the support has a peel layer and a barrier layer superposed in order thereon.

6. The image forming process as claimed in claim 1, wherein the developing solution further contains a sulfate surface active agent, a sulfonate surface active agent or a phosphate surface active agent.

* * * * *